United States Patent
Son et al.

(10) Patent No.: US 7,167,045 B1
(45) Date of Patent: Jan. 23, 2007

(54) SYSTEM AND METHOD FOR MODIFYING OUTPUT POWER OF AN INFORMATION COMMUNICATION SYSTEM

(75) Inventors: Sang Won Son, Sunnyvale, CA (US);
King Chun Tsai, Sunnyvale, CA (US);
Yuan-Ju Chao, Cupertino, CA (US);
Lawrence Tse, Fremont, CA (US)

(73) Assignee: Marvell International Ltd., Hamilton (BM)

(*) Notice: Subject to any disclaimer, the term of this patent is extended or adjusted under 35 U.S.C. 154(b) by 114 days.

(21) Appl. No.: 10/861,481

(22) Filed: Jun. 7, 2004

(51) Int. Cl.
*H03G 5/16* (2006.01)
*H03F 3/26* (2006.01)

(52) U.S. Cl. .................. 330/130; 330/133; 330/254; 330/256; 330/272; 330/279; 330/285; 327/306

(58) Field of Classification Search .............. 330/278, 330/279, 285, 254, 289, 256, 266, 272, 133, 330/130; 327/306
See application file for complete search history.

(56) References Cited

U.S. PATENT DOCUMENTS

| | | | |
|---|---|---|---|
| 5,812,025 A | 9/1998 | Shimazaki | |
| 5,896,064 A * | 4/1999 | Kaku | 330/279 |
| 6,057,732 A * | 5/2000 | Morishita | 330/129 |
| 6,483,371 B1 | 11/2002 | Duthie et al. | |
| 6,590,686 B1 | 7/2003 | Sekiya et al. | |
| 2002/0158688 A1 | 10/2002 | Terosky et al. | |
| 2003/0013427 A1 | 1/2003 | Ishihara | |
| 2003/0040290 A1 | 2/2003 | Sahlman et al. | |
| 2003/0045257 A1 | 3/2003 | Kobayashi et al. | |

* cited by examiner

*Primary Examiner*—Michael B Shingleton (57) ABSTRACT

A system for communicating information includes a variable gain amplifier (VGA) responsive to an input signal and a gain control signal for controlling a gain of the VGA. The system also includes a power amplifier responsive to the VGA. An output power level of the power amplifier is compared to a predetermined reference value to generate the gain control signal. The gain control signal is offset by a gain offset value. To change the output power level of the power amplifier from a first output power level to a second output power level, a first predetermined reference value and a first gain offset value associated with the first output power level are changed substantially concurrently to a second predetermined reference value and a second gain offset value, respectively, associated with the second output power level.

59 Claims, 7 Drawing Sheets

SYSTEM AND METHOD FOR MODIFYING OUTPUT POWER OF AN INFORMATION COMMUNICATION SYSTEM

BACKGROUND

1. Field of the Invention

The present invention relates to information communication systems. More particularly, the present invention relates to a system and method for modifying output power of an information communication system.

2. Background Information

Automatic gain control (AGC) circuits are widely used in devices such as radio transceivers to, for example, compensate for variations in received signal strength. In transmitting information, the transceivers can be required to change gain very rapidly. For example, in certain wireless networking application, an access point transceiver must change gain from one packet to the next as successive packets are transmitted to different receivers over channels having different channel gains.

An AGC circuit generates a control signal responsive to signal strength or output power level, and can use this control signal to control the gain of a variable gain amplifier (VGA) that amplifies the signal input to the VGA. The amplified level of the input signal can be kept within the range of linear operation of other circuit elements that process the resulting signal.

One problem in this type of AGC circuit is that the AGC circuit may be employed in a product having different amplification requirements for different signals passing through transceiver. For a packet-based system, in which the signal strength detection and subsequent VGA gain adjustment occur once per packet, it can take several packets before the AGC circuit settles to the final target power, resulting in a slow adaptation speed. A further problem in this type of AGC circuit is that the gain control characteristics of the VGA itself may change due to, for example, temperature changes of the integrated circuit that comprises the transceiver. Excessive drift in the gain control characteristics of the VGA can result in the failure to keep the different amplified signals within the necessary range or to provide the appropriate amplification for each of the given signals.

SUMMARY OF THE INVENTION

A system and method are disclosed for modifying output power of an information communication system. In accordance with exemplary embodiments, according to a first aspect of the present invention, a system can include a variable gain amplifier (VGA) responsive to an input signal and a gain control signal for controlling a gain of the VGA. The system can also include a power amplifier responsive to the VGA. An output power level of the power amplifier can be compared to a predetermined reference value to generate the gain control signal. The gain control signal can be offset by a gain offset value. To change the output power level of the power amplifier from a first output power level to a second output power level, a first predetermined reference value and a first gain offset value associated with the first output power level can be changed substantially concurrently to a second predetermined reference value and a second gain offset value, respectively, associated with the second output power level.

According to the first aspect, the system can include a temperature sensor. The temperature sensor can sense a temperature of the system. The gain control signal can be further offset by a temperature offset value associated with the temperature sensed by the temperature sensor. The temperature offset value can modify the gain control signal to compensate the gain of the VGA for variations in the temperature of the system. The system can include conversion circuitry responsive to the temperature sensor. The conversion circuitry can convert the temperature sensed by the temperature sensor into the temperature offset value.

According to the first aspect, the system can include a comparator responsive to the power amplifier and the predetermined reference value. The comparator can compare the output power level of the power amplifier with the predetermined reference value. The system can include an accumulator responsive to the comparator. The gain offset value can offset an output of the accumulator. The output of the accumulator can be incremented by a predetermined value when an output of the comparator is positive, and the output of the accumulator can be decremented by the predetermined value when the output of the comparator is negative. The system can include a power detector responsive to the power amplifier. The power detector can detect the output power level of the power amplifier. The system can include a memory. The memory can store a plurality of predetermined reference values and a plurality of gain offset values. Each of a respective predetermined reference value and gain offset value can be associated with a different output power level of the power amplifier. According to an exemplary embodiment of the first aspect, the system can be formed on a monolithic substrate. The system can be compliant with a standard selected from the group consisting of I.E.E.E. 802.11, 802.11a, 802.11b, 802.11g, 802.11h, 802.11i and 802.11n, or any suitable wired or wireless standard. According to an exemplary embodiment of the first aspect, an integrated circuit can comprise the system.

According to a second aspect of the present invention, an integrated circuit includes a variable gain amplifier (VGA). The integrated circuit also includes a power amplifier responsive to the VGA. An output power level of the power amplifier can be compared to a first predetermined value to generate a gain control signal for controlling a gain of the VGA. The gain control signal can be offset by a first gain offset value. The first predetermined value and the first gain offset value can be associated with a first output power level of the power amplifier. To change the output power level of the power amplifier from the first output power level to a second output power level, the first predetermined value and the first gain offset value can be changed substantially concurrently to a second predetermined value and a second gain offset value, respectively, associated with the second output power level.

According to the second aspect, the integrated circuit includes a temperature sensor. The temperature sensor can detect a temperature of the integrated circuit. The gain control signal can be further offset by a temperature offset value associated with the temperature detected by the temperature sensor. The temperature offset value can alter the gain control signal to compensate the gain of the VGA for variations in the temperature of the integrated circuit. The integrated circuit can include conversion circuitry responsive to the temperature sensor. The conversion circuitry can convert the temperature detected by the temperature sensor into the temperature offset value. The integrated circuit can include a power detector responsive to the power amplifier. The power detector can determine the output power level of the power amplifier. The integrated circuit can include a comparator responsive to the power detector and the first predetermined value. The comparator can compare the output power level determined by the power detector with the first predetermined value. The integrated circuit can include an accumulator responsive to the comparator. The first gain offset value can offset an output of the accumulator. The output of the accumulator can be incremented by a predetermined value when an output of the comparator is positive, and the output of the accumulator can be decremented by the predetermined value when the output of the comparator is negative. According to an exemplary embodiment of the second aspect, the integrated circuit can be compliant with a standard selected from the group consisting of I.E.E.E. 802.11, 802.11a, 802.11b, 802.11g, 802.11h, 802.11i and 802.11n, or any suitable wireless or wired standard.

According to a third aspect of the present invention, a system includes a variable gain amplifier (VGA) responsive to an input signal and a gain control signal for controlling a gain of the VGA. The system includes a power amplifier responsive to the VGA. An output power level of the power amplifier can be compared to a predetermined reference value to generate the gain control signal. The gain control signal can be offset by a gain offset value. The system also includes a temperature sensor. The temperature sensor can sense a temperature of the system. The gain control signal can be further offset by a temperature offset value associated with the temperature sensed by the temperature sensor. The temperature offset value can alter the gain control signal to compensate the gain of the VGA for variations in the temperature of the system. To change the output power level of the power amplifier from a first output power level to a second output power level, a first predetermined reference value and a first gain offset value associated with the first output power level can be changed substantially concurrently to a second predetermined reference value and a second gain offset value, respectively, associated with the second output power level.

According to the third aspect, the system can include conversion circuitry responsive to the temperature sensor. The conversion circuitry can convert the temperature sensed by the temperature sensor into the temperature offset value. The system can include a comparator responsive to the power amplifier and the predetermined reference value. The comparator can compare the output power level of the power amplifier with the predetermined reference value. The system can include an accumulator responsive to the comparator. The gain offset value can offset an output of the accumulator. The output of the accumulator can be incremented by a predetermined value when an output of the comparator is positive, and the output of the accumulator can be decremented by the predetermined value when the output of the comparator is negative. The system can include a power detector responsive to the power amplifier. The power detector can detect the output power level of the power amplifier. The system can include a memory. The memory can store a plurality of predetermined reference values and a plurality of gain offset values. Each of a respective predetermined reference value and gain offset value can be associated with a different output power level of the power amplifier. According to an exemplary embodiment of the third aspect, the system can be formed on a monolithic substrate. The system can be compliant with a standard selected from the group consisting of I.E.E.E. 802.11, 802.11a, 802.11b, 802.11g, 802.11h, 802.11i and 802.11n, or any suitable wireless or wired standard. According to an exemplary embodiment of the third aspect, an integrated circuit can comprise the system.

According to a fourth aspect of the present invention, an integrated circuit can include a variable gain amplifier (VGA) responsive to an input signal and a gain control signal for controlling a gain of the VGA. The integrated circuit can include a power amplifier responsive to the VGA. The integrated circuit can include a power detector responsive to the power amplifier. The power detector can detect an output power level of the power amplifier. The integrated circuit can include a comparator responsive to the power detector. The comparator can compare the output power level of the power amplifier with a first predetermined value to generate the gain control signal. The integrated circuit can include an accumulator responsive to the comparator. An output of the accumulator can be offset by a first gain offset value. The first predetermined value and the first gain offset value can be associated with a first output power level of the power amplifier. The integrated circuit can include a temperature sensor. The gain control signal can be further offset by a temperature offset value associated with a temperature of the integrated circuit sensed by the temperature sensor. The temperature offset value can alter the gain control signal to compensate the gain of the VGA for variations in the temperature of the integrated circuit. The integrated circuit can include conversion circuitry responsive to the temperature sensor. The conversion circuitry can convert the temperature sensed by the temperature sensor into the temperature offset value. To change the output power level of the power amplifier from the first output power level to a second output power level, the first predetermined reference value and the first gain offset value can be changed substantially simultaneously to a second predetermined reference value and a second gain offset value, respectively, associated with the second output power level. According to an exemplary embodiment of the fourth aspect, the integrated circuit can be compliant with a standard selected from the group consisting of I.E.E.E. 802.11, 802.11a, 802.11b, 802.11g, 802.11h, 802.11i and 802.11n, or any suitable wireless or wired standard.

According to a fifth aspect of the present invention, a system for communicating information includes means for amplifying an input signal. The system includes means for amplifying power responsive to the input signal amplifying means. The system includes means for controlling a gain of the input signal amplifying means. The input signal amplifying means is responsive to the gain controlling means. An output power level of the power amplifying means is compared to a predetermined reference value by the gain controlling means to generate a gain control signal. The gain control signal is offset by a gain offset value. To change the output power level of the power amplifying means from a first output power level to a second output power level, a first predetermined reference value and a first gain offset value associated with the first output power level are changed substantially concurrently to a second predetermined reference value and a second gain offset value, respectively, associated with the second output power level.

According to the fifth aspect, the gain controlling means can include means for sensing a temperature of the system. The gain control signal can be further offset by a temperature offset value associated with the temperature sensed by the temperature sensing means. The temperature offset value can modify the gain control signal to compensate the gain of the input signal amplifying means for variations in the temperature of the system. The gain controlling means can include means for converting the temperature sensed by the temperature sensing means into the temperature offset value. The gain controlling means can include means for comparing the output power level of the power amplifying means with the predetermined reference value. The gain controlling means can include means for accumulating responsive to the comparing means. The gain offset value can offset an output of the accumulating means. The output of the accumulating means can be incremented by a predetermined value when an output of the comparing means is positive, and the output of the accumulating means can be decremented by the predetermined value when the output of the comparing means is negative. The gain controlling means can include means for detecting the output power level of the power amplifying means. The system can include means for storing information. The information storing means can store a plurality of predetermined reference values and a plurality of gain offset values. Each of a respective predetermined reference value and gain offset value can be associated with a different output power level of the power amplifying means. According to an exemplary embodiment of the fifth aspect, the system can be formed on a monolithic substrate. The system can be compliant with a standard selected from the group consisting of I.E.E.E. 802.11, 802.11a, 802.11b, 802.11g, 802.11h, 802.11i and 802.11n, or any suitable wireless or wired standard. According to an exemplary embodiment of the fifth aspect, an integrated circuit can comprise the system.

According to a sixth aspect of the present invention, an integrated circuit includes means for amplifying a signal. The integrated circuit includes means for amplifying power responsive to the signal amplifying means. An output power level of the power amplifying means can be compared to a first predetermined value to generate a gain control signal for controlling a gain of the signal amplifying means. The gain control signal can be offset by a first gain offset value. The first predetermined value and the first gain offset value can be associated with a first output power level of the power amplifying means. To change the output power level of the power amplifying means from the first output power level to a second output power level, the first predetermined value and the first gain offset value can be changed substantially concurrently to a second predetermined value and a second gain offset value, respectively, associated with the second output power level.

According to the sixth aspect, the integrated circuit can include means for detecting a temperature of the integrated circuit. The gain control signal can be further offset by a temperature offset value associated with the temperature detected by the temperature detecting means. The temperature offset value can alter the gain control signal to compensate the gain of the signal amplifying means for variations in the temperature of the integrated circuit. The integrated circuit can include means for converting the temperature detected by the temperature detecting means into the temperature offset value. The integrated circuit can include means for determining the output power level of the power amplifying means. The integrated circuit can include means for comparing the output power level determined by the power determining means with the first predetermined value. The integrated circuit can include means for accumulating responsive to the comparing means. The first gain offset value can offset an output of the accumulating means. The output of the accumulating means can be incremented by a predetermined value when an output of the comparing means is positive, and the output of the accumulating means can be decremented by the predetermined value when the output of the comparing means is negative. According to an exemplary embodiment of the sixth aspect, the integrated circuit can be compliant with a standard selected from the group consisting of I.E.E.E. 802.11, 802.11a, 802.11b, 802.11g, 802.11h, 802.11i and 802.11n, or any suitable wireless or wired standard.

According to a seventh aspect of the present invention, a system includes means for amplifying a signal. The system includes means for amplifying power responsive to the signal amplifying means. The system includes means for controlling a gain of the signal amplifying means. The signal amplifying means is responsive to the gain controlling means. An output power level of the power amplifying means can be compared to a predetermined reference value by the gain controlling means to generate a gain control signal. The gain control signal can be offset by a gain offset value. The system includes means for sensing a temperature of the system. The gain control signal can be further offset by a temperature offset value associated with the temperature sensed by the temperature sensing means. The temperature offset value can alter the gain control signal to compensate the gain of the signal amplifying means for variations in the temperature of the system. To change the output power level of the power amplifying means from a first output power level to a second output power level, a first predetermined reference value and a first gain offset value associated with the first output power level can be changed substantially concurrently to a second predetermined reference value and a second gain offset value, respectively, associated with the second output power level.

According to the seventh aspect, the gain controlling means can include means for converting the temperature sensed by the temperature sensing means into the temperature offset value. The gain controlling means can include means for comparing the output power level of the power amplifying means with the predetermined reference value. The gain controlling means can include means for accumulating responsive to the comparing means. The gain offset value can offset an output of the accumulating means. The output of the accumulating means can be incremented by a predetermined value when an output of the comparing means is positive, and the output of the accumulating means can be decremented by the predetermined value when the output of the comparing means is negative. The system can include means for detecting the output power level of the power amplifying means. The system can include means for storing a plurality of predetermined reference values and a plurality of gain offset values. Each of a respective predetermined reference value and gain offset value can be associated with a different output power level of the power amplifying means. According to an exemplary embodiment of the seventh aspect, the system can be formed on a monolithic substrate. The system can be compliant with a standard selected from the group consisting of I.E.E.E. 802.11, 802.11a, 802.11b, 802.11g, 802.11h, 802.11i and 802.11n, or any suitable wireless or wired standard. According to an exemplary embodiment of the seventh aspect, an integrated circuit can comprise the system.

According to an eighth aspect of the present invention, an integrated circuit includes means for amplifying an input signal, means for amplifying power responsive to the input signal amplifying means, and means for detecting an output power level of the power amplifying means. The integrated circuit includes means for comparing the output power level of the power amplifying means with a first predetermined value to generate a gain control signal for controlling a gain of the input signal amplifying means. The integrated circuit includes means for accumulating responsive to the comparing means. An output of the means for accumulating can be offset by a first gain offset value. The first predetermined value and the first gain offset value can be associated with a first output power level of the power amplifying means. The integrated circuit includes means for sensing a temperature of the integrated circuit. The gain control signal can be further offset by a temperature offset value associated with the temperature of the integrated circuit. The temperature offset value can alter the gain control signal to compensate the gain of the input signal amplifying means for variations in the temperature of the integrated circuit. The integrated circuit includes means for converting the temperature sensed by the temperature sensing means into the temperature offset value. To change the output power level of the power amplifying means from the first output power level to a second output power level, the first predetermined reference value and the first gain offset value can be changed substantially simultaneously to a second predetermined reference value and a second gain offset value, respectively, associated with the second output power level. According to an exemplary embodiment of the eighth aspect, the integrated circuit can be compliant with a standard selected from the group consisting of I.E.E.E. 802.11, 802.11a, 802.11b, 802.11g, 802.11h, 802.11i and 802.11n, or any suitable wireless or wired standard.

According to a ninth aspect of the present invention, a method for modifying output power includes the steps of: a.) amplifying an input signal; b.) amplifying power of an output of step (a); and c.) controlling a gain of step (a), wherein step (a) is responsive to step (c), and wherein step (c) comprises the steps of: c1.) comparing an output power level of step (b) to a predetermined reference value to generate a gain control signal, and c2.) offsetting the gain control signal by a gain offset value; and d.) changing the output power level of step (b) from a first output power level to a second output power level, wherein a first predetermined reference value and a first gain offset value associated with the first output power level are changed substantially concurrently to a second predetermined reference value and a second gain offset value, respectively, associated with the second output power level.

According to the ninth aspect, step (c) further includes the steps of: c3.) sensing a temperature; and c4.) offsetting the gain control signal by a temperature offset value associated with the temperature sensed by step (c3), wherein the temperature offset value modifies the gain control signal to compensate the gain of step (a) for variations in the temperature. Step (c) further includes the step of: c5.) converting the temperature sensed by step (c3) into the temperature offset value. Step (c) further includes the step of: c3.) accumulating the output of step (c1), wherein the gain offset value offsets an output of step (c3). The output of step (c3) can be incremented by a predetermined value when the output of step (c1) is positive, and the output of step (c3) can be decremented by the predetermined value when the output of step (c1) is negative. Step (c) further includes the step of: c3.) detecting the output power level of the step (b). The method includes the step of: e.) storing a plurality of predetermined reference values and a plurality of gain offset values, wherein each of a respective predetermined reference value and gain offset value are associated with a different output power level of step (b). The method can be compliant with a standard selected from the group consisting of I.E.E.E. 802.11, 802.11a, 802.11b, 802.11g, 802.11h, 802.11i and 802.11n, or any suitable wireless or wired standard.

According to a tenth aspect of the present invention, a method for modifying output power includes the steps of: a.) amplifying a signal; and b.) amplifying power of an output of step (a), wherein an output power level of step (b) is compared to a first predetermined value to generate a gain control signal for controlling a gain of step (a), wherein the gain control signal is offset by a first gain offset value, wherein the first predetermined value and the first gain offset value are associated with a first output power level of step (b), and wherein to change the output power level of step (b) from the first output power level to a second output power level, the first predetermined value and the first gain offset value are changed substantially concurrently to a second predetermined value and a second gain offset value, respectively, associated with the second output power level.

According to the tenth aspect, the method can include the steps of: c.) detecting a temperature of the integrated circuit; and d.) offsetting the gain control signal by a temperature offset value associated with the temperature detected by step (c), wherein the temperature offset value alters the gain control signal to compensate the gain of step (a) for variations in the temperature of the integrated circuit. The method can include the step of: e.) converting the temperature detected by step (c) into the temperature offset value. The method can include the steps of: c.) determining the output power level of step (b); d.) comparing the output power level determined by step (c) with the first predetermined value; and e.) accumulating an output of step (d), wherein the gain offset value offsets an output of step (e). The output of step (e) can be incremented by a predetermined value when the output of step (d) is positive, and the output of step (e) can be decremented by the predetermined value when the output of step (d) is negative. According to an exemplary embodiment of the tenth aspect, the method can be compliant with a standard selected from the group consisting of I.E.E.E. 802.11, 802.11a, 802.11b, 802.11g, 802.11h, 802.11i and 802.11n, or any suitable wireless or wired standard.

According to an eleventh aspect of the present invention, a method for modifying output power includes the steps of: a.) amplifying a signal; b.) amplifying power output by step (a); c.) controlling a gain of step (a), wherein step (a) is responsive to step (c), wherein an output power level of step (b) is compared to a predetermined reference value by step (c) to generate a gain control signal, and wherein the gain control signal is offset by a gain offset value; d.) sensing a temperature, wherein the gain control signal is further offset by a temperature offset value associated with the temperature sensed by step (d), wherein the temperature offset value alters the gain control signal to compensate the gain of step (a) for variations in the temperature; and e.) changing the output power level of the step (b) from a first output power level to a second output power level, wherein a first predetermined reference value and a first gain offset value associated with the first output power level are changed substantially concurrently to a second predetermined reference value and a second gain offset value, respectively, associated with the second output power level.

According to the eleventh aspect, the method can include the steps of: f.) converting the temperature sensed by step (d) into the temperature offset value. Step (c) can include the steps of: c1.) comparing the output power level of step (b) with the predetermined reference value; and c2.) accumulating the output of step (c1), wherein the gain offset value offsets an output of step (c2). The output of step (c2) can be incremented by a predetermined value when the output of step (c1) is positive, and the output of step (c2) can be decremented by the predetermined value when the output of step (c1) is negative. Step (c) can include the step of: c1.) detecting the output power level of step (b). The method can include the step of: f.) storing a plurality of predetermined reference values and a plurality of gain offset values, wherein each of a respective predetermined reference value and gain offset value are associated with a different output power level of step (b). The method can be compliant with a standard selected from the group consisting of I.E.E.E. 802.11, 802.11a, 802.11b, 802.11g, 802.11h, 802.11i and 802.11n, or any suitable wireless or wired standard.

According to an eleventh aspect of the present invention, a method for modifying output power includes the steps of: a.) amplifying an input signal; b.) amplifying power of an output of step (a); c.) detecting an output power level of step (b); d.) comparing the output power level of step (b) with a first predetermined value to generate a gain control signal for controlling a gain of step (a); e.) accumulating an output of step (d), wherein an output of step (e) is offset by a first gain offset value, and wherein the first predetermined value and the first gain offset value are associated with a first output power level of step (b); f.) sensing a temperature, wherein the gain control signal is further offset by a temperature offset value associated with the temperature, and wherein the temperature offset value alters the gain control signal to compensate the gain of step (a) for variations in the temperature; g.) converting the temperature sensed by step (f) into the temperature offset value; and h.) changing the output power level of step (b) from the first output power level to a second output power level, wherein the first predetermined reference value and the first gain offset value are changed substantially simultaneously to a second predetermined reference value and a second gain offset value, respectively, associated with the second output power level. According to an exemplary embodiment of the eleventh aspect, the method can be compliant with a standard selected from the group consisting of I.E.E.E. 802.11, 802.11a, 802.11b, 802.11g, 802.11h, 802.11i and 802.11n, or any suitable wireless or wired standard.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Exemplary embodiments of the present invention are directed to a system and method for modifying the output power level of an information communication system. The system includes a variable gain amplifier (VGA) followed by a power amplifier. The power amplifier can be formed as an integral part of, for example, a transceiver integrated circuit, or exist as, for example, a separately-packaged off-chip component. The gain applied by the VGA to an input signal is controlled by a gain control signal that is generated by comparing the power output by the power amplifier, as detected by a power detector, with a reference value representing a target output power. The gain control signal is offset by a gain offset value before being applied to the VGA. According to an exemplary embodiment, when a change in output power is desired, both the reference value and the gain offset value are changed substantially simultaneously to rapidly hop between different power levels. According to an additional exemplary embodiment, the gain control signal can be further offset according to the output of a temperature sensor that senses the temperature of the integrated circuit, to compensate the gain of the VGA for variations in the temperature of the integrated circuit.

According to exemplary embodiments, a power control loop formed by the VGA, the power amplifier, the power detector, a comparator, and an accumulator remains closed before and after the power level hopping, such as from a first power level to a second power level. If the system continues to transmit at the second power level for a number of subsequent packets, the power control loop can correct for any error due to possible discrepancies between a new predetermined reference value and a new gain offset. The discrepancies can be the result of, for example, a drift in gain control characteristics of the VGA, such that a mismatch exists between the difference between first and second predetermined reference values, and the difference between first and second gain offset values. Exemplary embodiments of the present invention thus preserve the accuracy of a closed power control loop while providing the capability of fast power level hopping.

Figure 1:
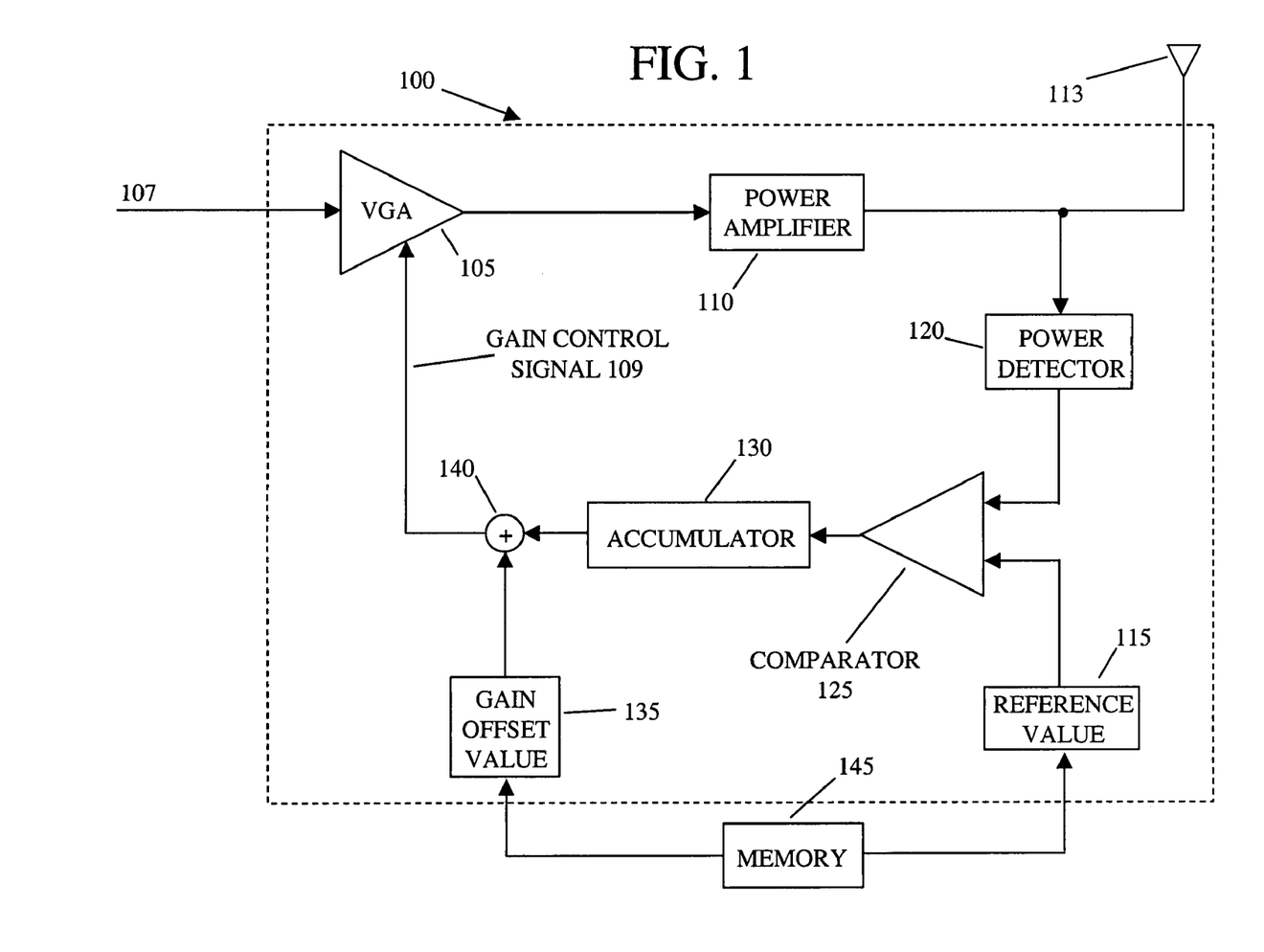
FIG. 1 is a diagram illustrating a system for modifying an output power level of an information communication system, in accordance with an exemplary embodiment of the present invention.

These and other aspects of the present invention will now be described in greater detail. FIG. 1 is a diagram illustrating a system 100 for modifying the output power level of an information communication system, in accordance with an exemplary embodiment of the present invention. The system 100 includes a VGA 105. The VGA 105 is responsive to an input signal 107 and a gain control signal 109. The VGA 105 amplifies the input signal 107 by an appropriate gain to generate an amplified signal. The gain control signal 109 can control the gain of the VGA 105. The system 100 includes a power amplifier 110. The power amplifier 110 is responsive to the VGA 105. The power amplifier 110 outputs the amplified signal at an appropriate output power level for transmission via, for example, an antenna 113.

To control the gain of the VGA 105, the output power level of power amplifier 110 is compared to a predetermined reference value 115 to generate the gain control signal. The system 100 includes a power detector 120. The power detector 120 is responsive to the power amplifier 110. The power detector 120 detects the output power level of the power amplifier 110, e.g., the amount of power transmitted to the antenna 113. The system 100 includes a comparator 125. The comparator 125 is responsive to the power detector 120 and the predetermined reference value 115. The comparator 125 compares the output power level of the power amplifier 110 (as detected by, for example, power detector 120) with the predetermined reference value 115 to generate, for example, a difference value between the detected output power level of the power amplifier 110 and the predetermined reference value. The predetermined reference value 115 is any suitable target output power level of the system 100. The comparison result (e.g., the difference value) output by the comparator 125 is the gain control signal 109 for controlling the gain of the VGA 105. Optionally, the output of the comparator 125 can be applied to an accumulator 130 to produce a cumulative sum of the difference values output by the comparator 125. For example, the output of accumulator 130 can be incremented by, for example, one or any suitable value at the end of a packet if the output of comparator 125 is positive during that packet. Similarly, the output of accumulator 130 can be decremented by, for example, one or any suitable value at the end of the packet if the output of comparator 125 is negative during that packet.

According to exemplary embodiments, the gain control signal 109 output by the accumulator 130 is offset by a gain offset value 135. The gain offset value 135 can compensate for changes in gain control characteristics of the VGA 105, such as, for example, design changes using different amplifiers, impedance matching, variable power supplies, and the like, to achieve more accurate control of the output power level of the system 100. The gain offset value 135 can be added to the gain control signal 109 using a summing circuit 140 before being applied to the VGA 105.

According to an exemplary embodiment of the present invention, the power output of the system 100 can be rapidly hopped or otherwise changed between different levels. A first predetermined reference value 115 and a first gain offset value 135 are associated with a first output power level of the power amplifier 110. To change the output power level of the power amplifier 110 from the first output power level to a second output power level, the first predetermined reference value 135 and the first gain offset value 135 are changed substantially simultaneously to a second predetermined reference value 115 and a second gain offset value 135, respectively, associated with the second output power level. By changing the gain offset value 135, the VGA 105 will substantially immediately respond by incrementing or decrementing its gain by an amount equal to the difference between the first and second gain offset values 135. The change in gain results in a new output power level at the output of the power amplifier 110. The new output power level is then checked against the second predetermined reference value 115 to verify if the previous gain hop is adequate to accurately bring the output power level to the second output power level corresponding to the second predetermined reference value 115. Since the power control loop remains closed throughout the process, even if a discrepancy exists between the new output power level and the second predetermined reference value 115, the power control loop will continue to perform fine-step adjustment on a per-packet basis until the second output power level is obtained.

Any suitable output power level of the power amplifier 110 can be quickly achieved by changing the predetermined reference value 115 and the gain offset value 135 to the appropriate values substantially simultaneously. According to exemplary embodiments, a memory 145 can store a plurality of predetermined reference values 115 and gain offset values 135 (e.g., in a look-up table) for supply to the comparator 125 and to the summing circuit 140, respectively. Each of a respective predetermined reference value 115 and gain offset value 135 are associated with a different output power level of the power amplifier 110.

Figure 2:
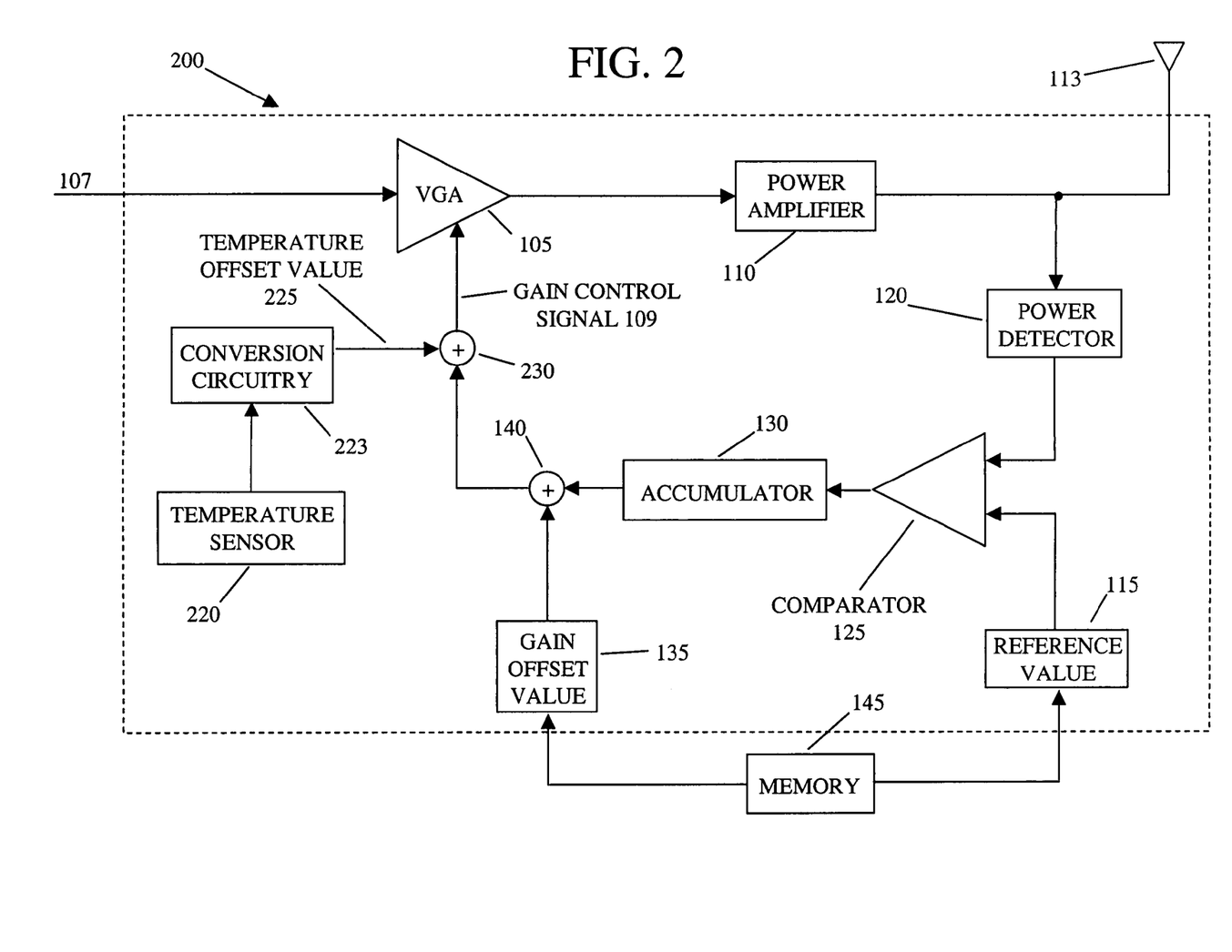
FIG. 2 is a diagram illustrating a system for modifying an output power level of an information communication system, in accordance with an alternative exemplary embodiment of the present invention.

FIG. 2 is a diagram illustrating a system 200 for modifying the output power level of an information communication system, in accordance with an alternative exemplary embodiment of the present invention. Changes in temperature of the system 200 can alter the gain control characteristics of the VGA 105, thereby changing the output power level of the system 200. For example, if the temperature of the system 200 increases, the gain of the VGA 105 can decrease. To compensate for changes in temperature, the system 200 can include a temperature sensor 220 to sense the temperature of the system 200. The gain control signal 109 can be further offset by a temperature offset value 225 associated with the temperature sensed by the temperature sensor 220. The temperature offset value 225 modifies the gain control signal 109 (e.g., using summing circuit 230) to compensate the gain of the VGA 105 for variations in the temperature of the system 200. More accurate control over the output power level of the system 200 can thus be achieved.

To convert the temperature sensed by the temperature sensor 220 into the temperature offset value 225, the system 200 can include conversion circuitry 223 that is responsive to the temperature sensor 220. For example, the conversion circuitry 223 can be logic circuitry that performs a function of the temperature dependence of the gain of the system 200, for example, to retrieve a suitable temperature offset value 225 from a look-up table. For example, as the temperature of the system 200 increases, the temperature offset value 225 retrieved from the look-up table would increase to compensate for the reduction in gain caused by the increased temperature. Alternatively, the conversion circuitry 223 can multiply the temperature sensed by the temperature sensor 220 by an appropriate scaling factor to generate the temperature offset value 225. For example, the scaling factor can be stored in a look-up table in memory or otherwise software controlled.

Exemplary embodiments of the present invention can be used, for example, to modify the output power for communicating information over communication channels either wirelessly or by wired means. For example, systems 100 and 200 can be compliant with standards such as, for example, I.E.E.E. 802.11, 802.11a, 802.11b, 802.11g, 802.11h, 802.11i and 802.11n, or any other suitable wireless or wired standard. However, systems 100 and 200 can be used in any device or system that communicates information, including both wired and wireless communication systems, read channel devices, disk drive systems (e.g., those employing read channel devices), other magnetic storage or recording applications, and the like, particularly where the information is to be communicated at different output power levels.

The input signal 107 can be any suitable type of electrical signal that is capable of communicating electrical information. The VGA 105, power amplifier 110, power detector 120, comparator 125, accumulator 130, summing circuits 140 and 230, temperature sensor 220 and conversion circuitry 223 can each be implemented using any suitable means for performing the functions associated with the respective element. The VGA 105, power amplifier 110, power detector 120, comparator 125, accumulator 130, summing circuits 140 and 230, temperature sensor 220 and conversion circuitry 223, or any combination thereof, can be formed on, for example, a monolithic substrate. Alternatively, each element, or any combination thereof, can be any suitable type of electrical or electronic component or device that is capable of performing the functions associated with the respective element. According to such an alternative exemplary embodiment, each component or device can be in communication with another component or device using any appropriate type of electrical connection that is capable of carrying electrical information. The memory 145 can be any type of computer memory or any other type of electronic storage medium that is located either internally or externally to the systems 100 and 200, such as, for example, read-only memory (ROM), random access memory (RAM), cache memory, compact disc read-only memory (CDROM), electro-optical memory, magneto-optical memory, or the like.

Figure 3:
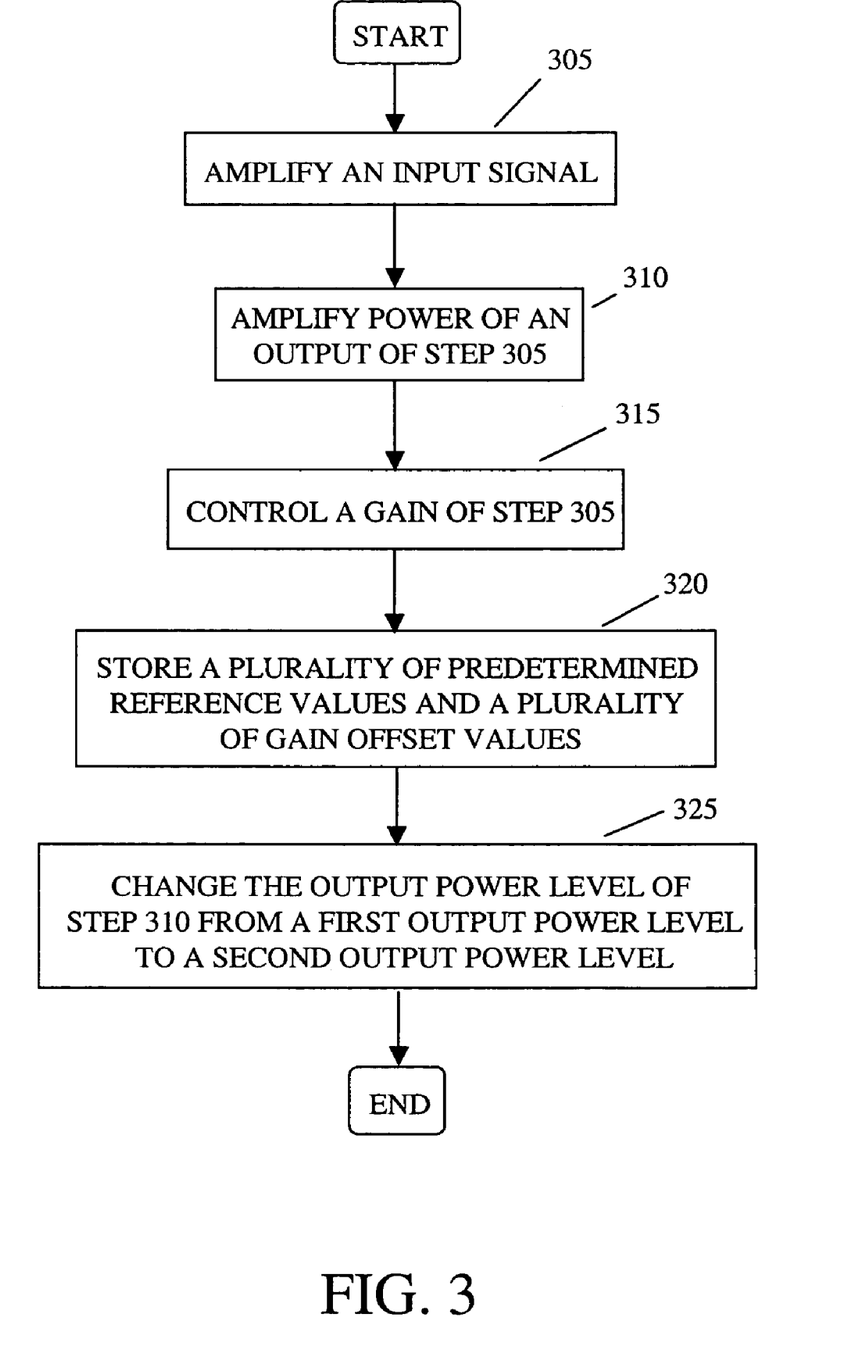
FIG. 3 is a flowchart illustrating steps for modifying output power, in accordance with an exemplary embodiment of the present invention.

FIG. 3 is a flowchart illustrating steps for modifying output power, in accordance with an exemplary embodiment of the present invention. In step 305, an input signal is amplified. In step 310, the power of an output of step 305 is amplified. In step 315, the gain of step 305 is controlled. Step 315 is responsive to step 305. In step 320, a plurality of predetermined reference values and a plurality of gain offset values are stored. Each of a respective predetermined reference value and gain offset value are associated with a different output power level of step 310. In step 325, the output power level of step 310 is changed from a first output power level to a second output power level. A first predetermined reference value and a first gain offset value associated with the first output power level are changed substantially concurrently to a second predetermined reference value and a second gain offset value, respectively, associated with the second output power level.

Figure 4:
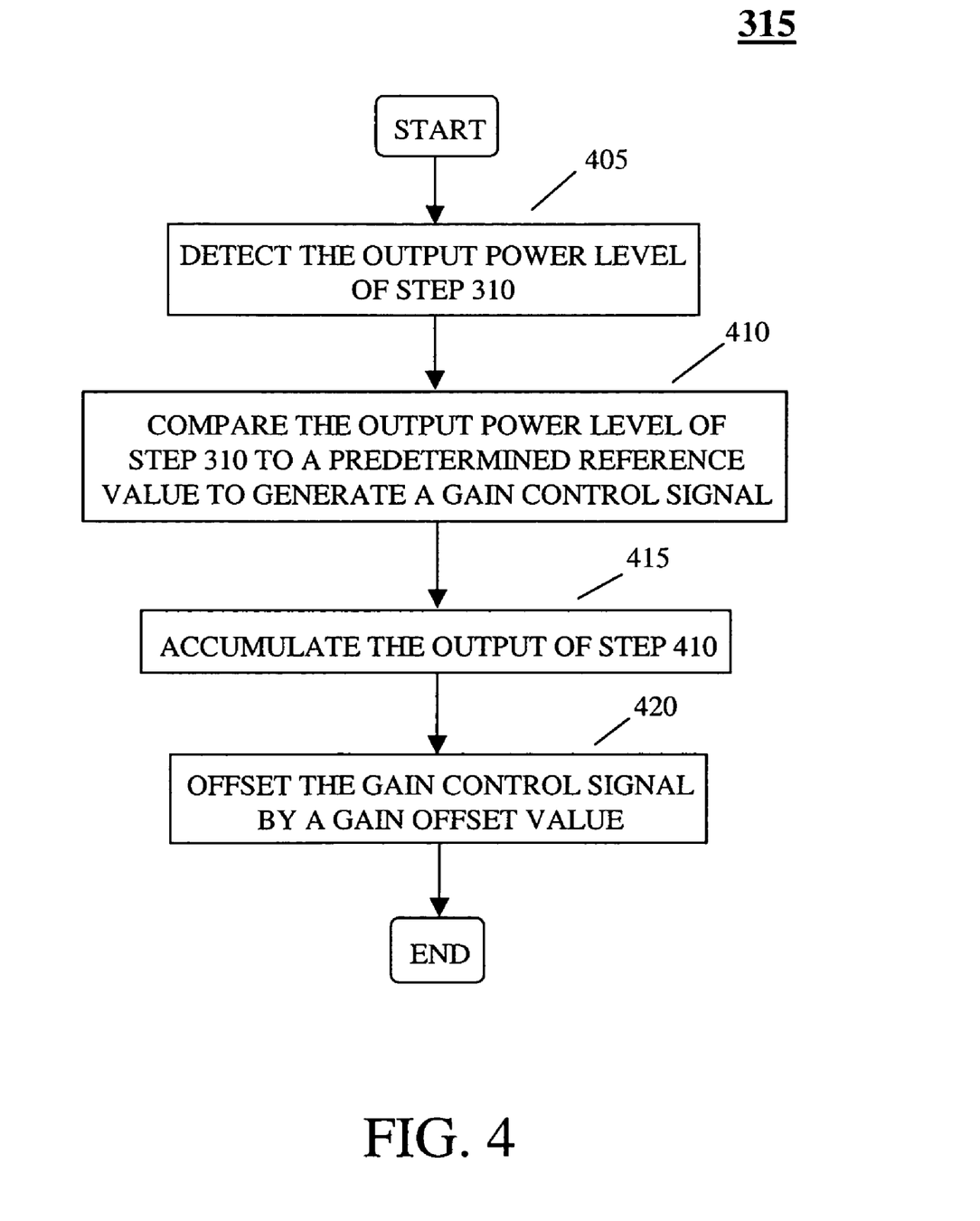
FIG. 4 is a flowchart illustrating steps for controlling gain, in accordance with an exemplary embodiment of the present invention.

FIG. 4 is a flowchart illustrating steps for controlling gain, in accordance with an exemplary embodiment of the present invention. In step 405, the output power level of step 310 is detected. In step 410, an output power level of step 310 is compared to a predetermined reference value to generate a gain control signal. In step 415, the output of step 410 is accumulated. According to exemplary embodiments, the output of step 415 can be incremented by a predetermined value (e.g., one or any suitable value) when the output of step 410 is positive, and the output of step 415 can be decremented by the predetermined value when the output of step 410 is negative. In step 420, the gain control signal output by step 415 is offset by a gain offset value.

Figure 5:
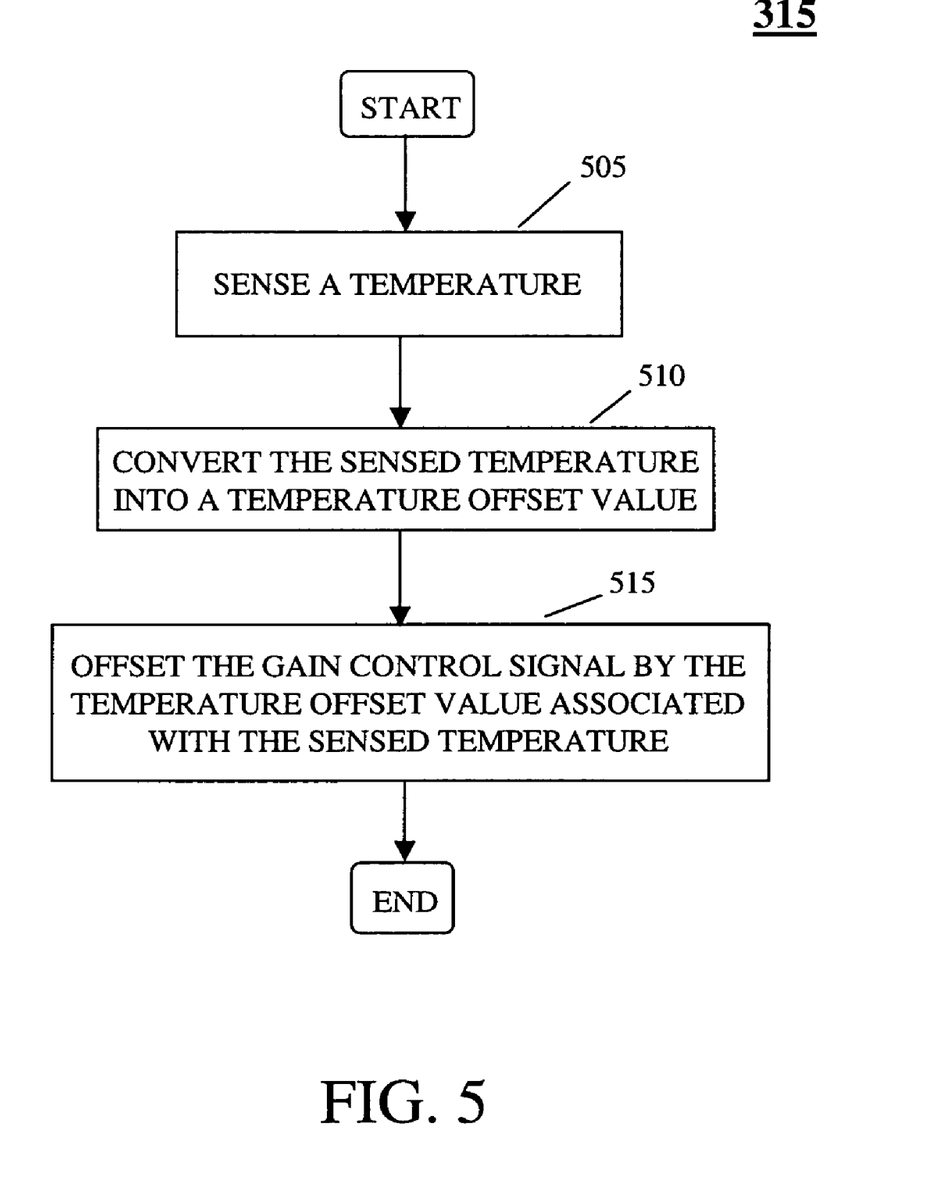
FIG. 5 is a flowchart illustrating steps for controlling gain, in accordance with an exemplary embodiment of the present invention.

FIG. 5 is a flowchart illustrating steps for controlling gain, in accordance with an exemplary embodiment of the present invention. In step 505, a temperature is sensed (e.g., an on-chip temperature of an integrated circuit). In step 510, the temperature sensed by step 505 is converted into a temperature offset value. In step 515, the gain control signal is offset by the temperature offset value associated with the temperature sensed by step 505. The temperature offset value modifies the gain control signal to compensate the gain of step 305 for variations in the temperature.

Figure 6:
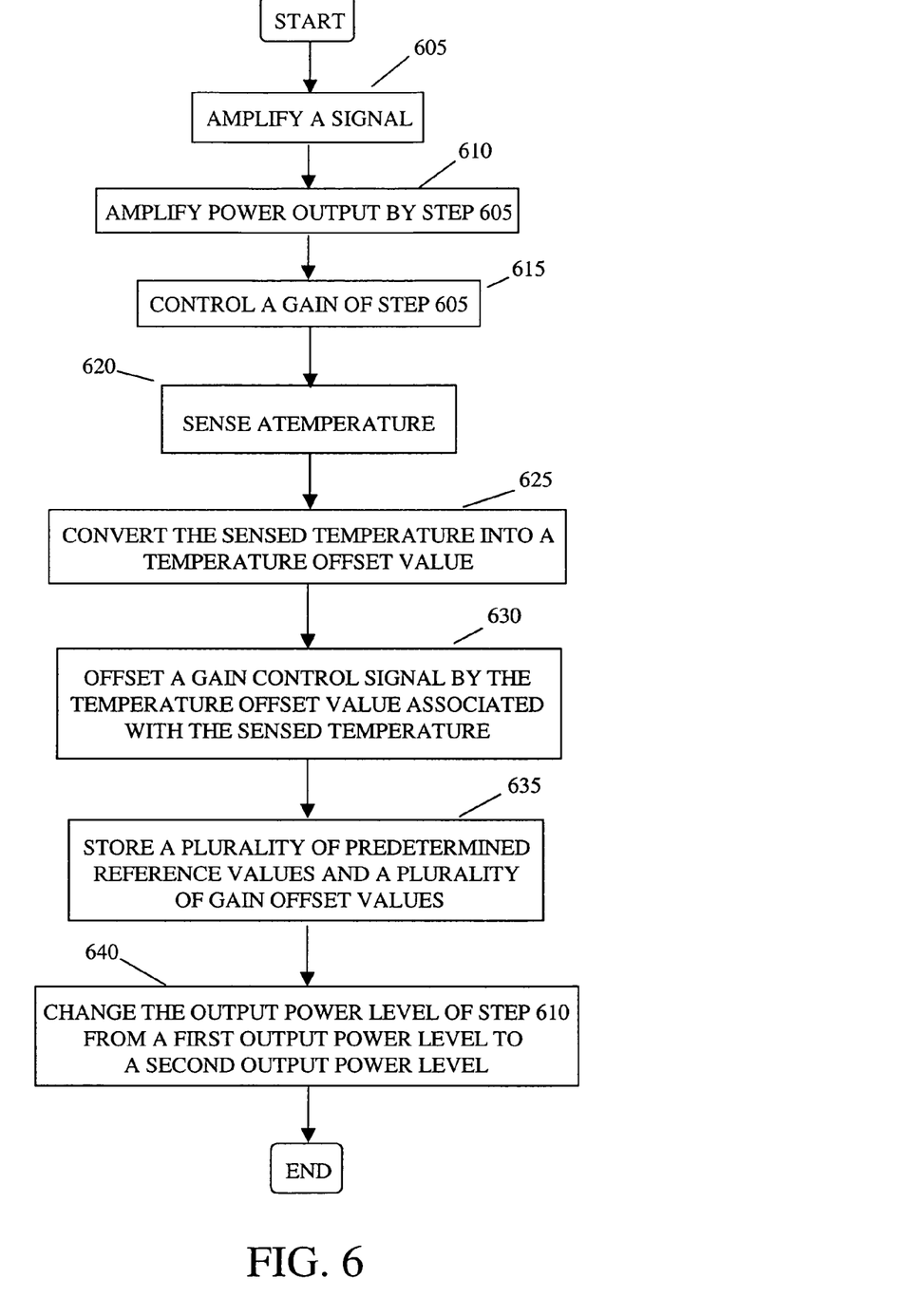
FIG. 6 is a flowchart illustrating steps for modifying output power, in accordance with an alternative exemplary embodiment of the present invention.

FIG. 6 is a flowchart illustrating steps for modifying output power, in accordance with an alternative exemplary embodiment of the present invention. In step 605, a signal is amplified. In step 610, power output by step 605 is amplified. In step 615, a gain of step 605 is controlled. Step 605 is responsive to step 615. According to exemplary embodiments, an output power level of step 610 is compared to a predetermined reference value by step 615 to generate a gain control signal. The gain control signal is offset by a gain offset value. In step 620, a temperature is sensed (e.g., an on-chip temperature of an integrated circuit). In step 625, the temperature sensed in step 620 is converted into a temperature offset value. In step 630, the gain control signal is offset by the temperature offset value associated with the temperature sensed by step 620. The temperature offset value alters the gain control signal to compensate the gain of step 605 for variations in the temperature. In step 635, a plurality of predetermined reference values and a plurality of gain offset values are stored. Each of a respective predetermined reference value and gain offset value are associated with a different output power level of step 610. In step 640, the output power level of step 610 is changed from a first output power level to a second output power level. A first predetermined reference value and a first gain offset value associated with the first output power level are changed substantially concurrently to a second predetermined reference value and a second gain offset value, respectively, associated with the second output power level.

Figure 7:
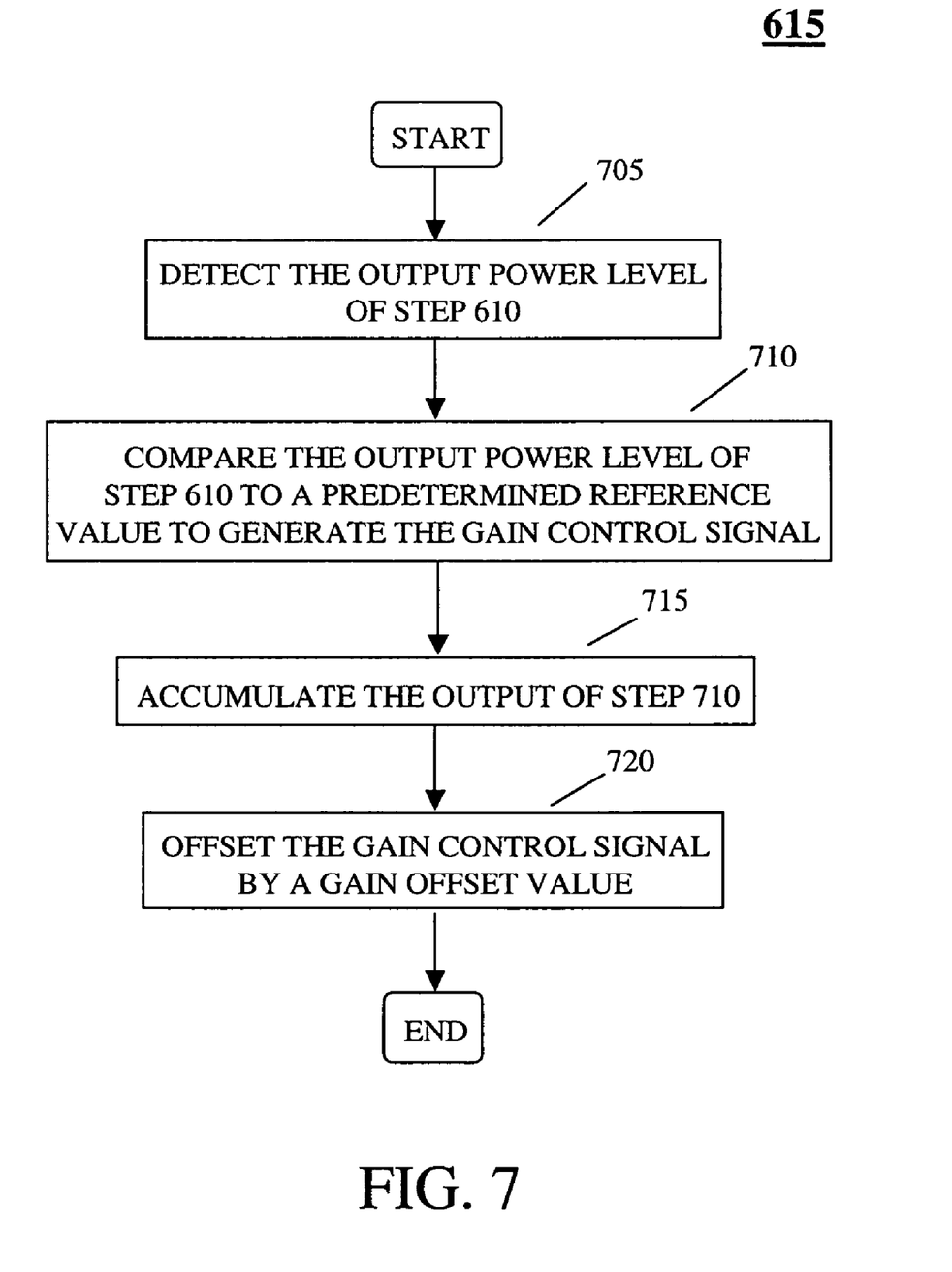
FIG. 7 is a flowchart illustrating steps for controlling gain, in accordance with the alternative exemplary embodiment of the present invention.

FIG. 7 is a flowchart illustrating steps for controlling gain, in accordance with the alternative exemplary embodiment of the present invention. In step 705, the output power level of step 610 is detected. In step 710, the output power level of step 610 is compared with the predetermined reference value to generate the gain control signal. In step 715, the output of step 710 is accumulated. According to exemplary embodiments, the output of step 715 can be incremented by a predetermined value (e.g., one or any suitable value) when the output of step 710 is positive, and the output of step 715 can be decremented by the predetermined value when the output of step 710 is negative. In step 720, the gain control signal output by step 715 is offset by a gain offset value.

According to exemplary embodiments of the present invention, the method illustrated in FIGS. 3–7 can be compliant with standards such as, for example, I.E.E.E. 802.11, 802.11a, 802.11b, 802.11g, 802.11h, 802.11i and 802.11n, or any suitable wireless or wired standard.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. A system formed on a monolithic substrate, comprising:
   a variable gain amplifier (VGA) responsive to an input signal and a gain control signal for controlling a gain of the VGA;
   a power amplifier responsive to the VGA;
   a power detector responsive to the power amplifier,
      wherein the power detector detects an output power level of the power amplifier;
   a comparator responsive to the power detector,
      wherein the comparator compares the output power level of the power amplifier with a first predetermined value to generate the gain control signal;
   an accumulator responsive to the comparator,
      wherein an output of the accumulator is offset by a first gain offset value, and
      wherein the first predetermined value and the first gain offset value are associated with a first output power level of the power amplifier;
   a temperature sensor,
      wherein the gain control signal is further offset by a temperature offset value associated with a temperature of the integrated circuit sensed by the temperature sensor, wherein the temperature offset value alters the gain control signal to compensate the gain of the VGA for variations in the temperature of the integrated circuit; and conversion circuitry responsive to the temperature sensor, wherein the conversion circuitry converts the temperature sensed by the temperature sensor into the temperature offset value, and wherein to change the output power level of the power amplifier from the first output power level to a second output power level, the first predetermined reference value and the first gain offset value are changed substantially simultaneously to a second predetermined reference value and a second gain offset value, respectively, associated with the second output power level.

2. The system of claim 1, wherein the system is compliant with a standard selected from the group consisting of I.E.E.E. 802.11, 802.11a, 802.11b, 802.11g, 802.11h, 802.11i and 802.11n.

3. A system formed on a monolithic substrate, comprising:
means for amplifying an input signal;
means for amplifying power responsive to the input signal amplifying means;
means for detecting an output power level of the power amplifying means;
means for comparing the output power level of the power amplifying means with a first predetermined value to generate a gain control signal for controlling a gain of the input signal amplifying means;
means for accumulating responsive to the comparing means,
    wherein an output of the means for accumulating is offset by a first gain offset value, and
    wherein the first predetermined value and the first gain offset value are associated with a first output power level of the power amplifying means;
means for sensing a temperature of the integrated circuit,
    wherein the gain control signal is further offset by a temperature offset value associated with the temperature of the integrated circuit,
    wherein the temperature offset value alters the gain control signal to compensate the gain of the input signal amplifying means for variations in the temperature of the integrated circuit; and
means for converting the temperature sensed by the temperature sensing means into the temperature offset value,
    wherein to change the output power level of the power amplifying means from the first output power level to a second output power level, the first predetermined reference value and the first gain offset value are changed substantially simultaneously to a second predetermined reference value and a second gain offset value, respectively, associated with the second output power level.

4. The system of claim 3, wherein the system is compliant with a standard selected from the group consisting of I.E.E.E. 802.11, 802.11a, 802.11b, 802.11g, 802.11h, 802.11i and 802.11n.

5. A system, comprising:
a variable gain amplifier (VGA) responsive to an input signal and a gain control signal for controlling a gain of the VGA;

a power amplifier responsive to the VGA,
    wherein an output power level of the power amplifier is compared to a predetermined reference value to generate the gain control signal,
    wherein the gain control signal is offset by a gain offset value, and
    wherein to change the output power level of the power amplifier from a first output power level to a second output power level, a first predetermined reference value and a first gain offset value associated with the first output power level are changed substantially concurrently to a second predetermined reference value and a second gain offset value, respectively, associated with the second output power level, wherein at least the second predetermined reference value is a stored value that is selected based on the second output power level; and
a memory,
    wherein the memory stores a plurality of predetermined reference values and a plurality of gain offset values,
    wherein each of a respective predetermined reference value and gain offset value are associated with a different output power level of the power amplifier.

6. A system, comprising:
a variable gain amplifier (VGA) responsive to an input signal and a gain control signal for controlling a gain of the VGA;
a power amplifier responsive to the VGA,
    wherein an output power level of the power amplifier is compared to a predetermined reference value to generate the gain control signal,
    wherein the gain control signal is offset by a gain offset value, and
    wherein to change the output power level of the power amplifier from a first output power level to a second output power level, a first predetermined reference value and a first gain offset value associated with the first output power level are changed substantially concurrently to a second predetermined reference value and a second gain offset value, respectively, associated with the second output power level, wherein at least the second predetermined reference value is a stored value that is selected based on the second output power level; and
a temperature sensor,
    wherein the temperature sensor senses a temperature of the system,
    wherein the gain control signal is further offset by a temperature offset value associated with the temperature sensed by the temperature sensor, and
    wherein the temperature offset value modifies the gain control signal to compensate the gain of the VGA for variations in the temperature of the system.

7. The system of claim 6, further comprising:
conversion circuitry responsive to the temperature sensor,
    wherein the conversion circuitry converts the temperature sensed by the temperature sensor into the temperature offset value.

8. The system of claim 5, further comprising:
a comparator responsive to the power amplifier and the predetermined reference value,
    wherein the comparator compares the output power level of the power amplifier with the predetermined reference value.

9. The system of claim 8, further comprising:
an accumulator responsive to the comparator,
wherein the gain offset value offsets an output of the accumulator.

10. The system of claim 9, wherein the output of the accumulator is incremented by a predetermined value when an output of the comparator is positive, and
wherein the output of the accumulator is decremented by the predetermined value when the output of the comparator is negative.

11. The system of claim 5, further comprising:
a power detector responsive to the power amplifier,
wherein the power detector detects the output power level of the power amplifier.

12. The system of claim 5, wherein the system is formed on a monolithic substrate.

13. The system of claim 5, wherein the system is compliant with a standard selected from the group consisting of I.E.E.E. 802.11, 802.11a, 802.11b, 802.11g, 802.11h, 802.11i and 802.11n.

14. An integrated circuit, comprising:
the system of claim 5.

15. A system, comprising:
a variable gain amplifier (VGA) responsive to an input signal and a gain control signal for controlling a gain of the VGA;
a power amplifier responsive to the VGA,
wherein an output power level of the power amplifier is compared to a predetermined reference value to generate the gain control signal,
wherein the gain control signal is offset by a gain offset value; and
a temperature sensor,
wherein the temperature sensor senses a temperature of the system,
wherein the gain control signal is further offset by a temperature offset value associated with the temperature sensed by the temperature sensor,
wherein the temperature offset value alters the gain control signal to compensate the gain of the VGA for variations in the temperature of the system, and
wherein to change the output power level of the power amplifier from a first output power level to a second output power level, a first predetermined reference value and a first gain offset value associated with the first output power level are changed substantially concurrently to a second predetermined reference value and a second gain offset value, respectively, associated with the second output power level.

16. The system of claim 15, further comprising:
conversion circuitry responsive to the temperature sensor,
wherein the conversion circuitry converts the temperature sensed by the temperature sensor into the temperature offset value.

17. The system of claim 15, further comprising:
a comparator responsive to the power amplifier and the predetermined reference value,
wherein the comparator compares the output power level of the power amplifier with the predetermined reference value.

18. The system of claim 17, further comprising:
an accumulator responsive to the comparator,
wherein the gain offset value offsets an output of the accumulator.

19. The system of claim 18, wherein the output of the accumulator is incremented by a predetermined value when an output of the comparator is positive, and
wherein the output of the accumulator is decremented by the predetermined value when the output of the comparator is negative.

20. The system of claim 15, further comprising:
a power detector responsive to the power amplifier,
wherein the power detector detects the output power level of the power amplifier.

21. The system of claim 15, further comprising:
a memory,
wherein the memory stores a plurality of predetermined reference values and a plurality of gain offset values,
wherein each of a respective predetermined reference value and gain offset value are associated with a different output power level of the power amplifier.

22. The system of claim 15, wherein the system is formed on a monolithic substrate.

23. The system of claim 15, wherein the system is compliant with a standard selected from the group consisting of I.E.E.E. 802.11, 802.11a, 802.11b, 802.11g, 802.11h, 802.11i and 802.11n.

24. An integrated circuit, comprising:
the system of claim 15.

25. A system, comprising:
means for amplifying an input signal;
means for amplifying power responsive to the input signal amplifying means;
means for controlling a gain of the input signal amplifying means,
wherein the input signal amplifying means is responsive to the gain controlling means,
wherein an output power level of the power amplifying means is compared to a predetermined reference value by the gain controlling means to generate a gain control signal,
wherein the gain control signal is offset by a gain offset value, and
wherein to change the output power level of the power amplifying means from a first output power level to a second output power level, a first predetermined reference value and a first gain offset value associated with the first output power level are changed substantially concurrently to a second predetermined reference value and a second gain offset value, respectively, associated with the second output power level, wherein at least the second predetermined reference value is a stored value that is selected based on the second output power level; and
memory means for storing information,
wherein the memory means stores a plurality of predetermined reference values and a plurality of gain offset values,
wherein each of a respective predetermined reference value and gain offset value are associated with a different output power level of the power amplifying means.

26. A system, comprising:
means for amplifying an input signal;
means for amplifying power responsive to the input signal amplifying means; and
means for controlling a gain of the input signal amplifying means,
wherein the input signal amplifying means is responsive to the gain controlling means,
wherein an output power level of the power amplifying means is compared to a predetermined reference value by the gain controlling means to generate a gain control signal, wherein the gain control signal is offset by a gain offset value, and wherein to chance the output power level of the power amplifying means from a first output power level to a second output power level, a first predetermined reference value and a first gain offset value associated with the first output power level are changed substantially concurrently to a second predetermined reference value and a second gain offset value, respectively, associated with the second output power level, wherein at least the second predetermined reference value is a stored value that is selected based on the second output power level, wherein the gain controlling means comprises:

means for sensing a temperature of the system, wherein the gain control signal is further offset by a temperature offset value associated with the temperature sensed by the temperature sensing means, and wherein the temperature offset value modifies the gain control signal to compensate the gain of the input signal amplifying means for variations in the temperature of the system.

27. The system of claim 26, wherein the gain controlling means comprises:

means for converting the temperature sensed by the temperature sensing means into the temperature offset value.

28. The system of claim 25, wherein the gain controlling means comprises:

means for comparing the output power level of the power amplifying means with the predetermined reference value.

29. The system of claim 28, wherein the gain controlling means comprises:

means for accumulating responsive to the comparing means, wherein the gain offset value offsets an output of the accumulating means.

30. The system of claim 29, wherein the output of the accumulating means is incremented by a predetermined value when an output of the comparing means is positive, and wherein the output of the accumulating means is decremented by the predetermined value when the output of the comparing means is negative.

31. The system of claim 25, wherein the gain controlling means comprises:

means for detecting the output power level of the power amplifying means.

32. The system of claim 25, wherein the system is formed on a monolithic substrate.

33. The system of claim 25, wherein the system is compliant with a standard selected from the group consisting of I.E.E.E. 802.11, 802.11a, 802.11b, 802.11g, 802.11h, 802.11i and 802.11n.

34. An integrated circuit, comprising:

the system of claim 25.

35. A system, comprising:

means for amplifying a signal;

means for amplifying power responsive to the signal amplifying means;

means for controlling a gain of the signal amplifying means, wherein the signal amplifying means is responsive to the gain controlling means, wherein an output power level of the power amplifying means is compared to a predetermined reference value by the gain controlling means to generate a gain control signal, and wherein the gain control signal is offset by a gain offset value; and means for sensing a temperature of the system, wherein the gain control signal is further offset by a temperature offset value associated with the temperature sensed by the temperature sensing means, wherein the temperature offset value alters the gain control signal to compensate the gain of the signal amplifying means for variations in the temperature of the system, and wherein to change the output power level of the power amplifying means from a first output power level to a second output power level, a first predetermined reference value and a first gain offset value associated with the first output power level are changed substantially concurrently to a second predetermined reference value and a second gain offset value, respectively, associated with the second output power level.

36. The system of claim 35, wherein the gain controlling means comprises:

means for converting the temperature sensed by the temperature sensing means into the temperature offset value.

37. The system of claim 35, wherein the gain controlling means comprises:

means for comparing the output power level of the power amplifying means with the predetermined reference value.

38. The system of claim 37, wherein the gain controlling means comprises:

means for accumulating responsive to the comparing means, wherein the gain offset value offsets an output of the accumulating means.

39. The system of claim 38, wherein the output of the accumulating means is incremented by a predetermined value when an output of the comparing means is positive, and wherein the output of the accumulating means is decremented by the predetermined value when the output of the comparing means is negative.

40. The system of claim 35, further comprising:

means for detecting the output power level of the power amplifying means.

41. The system of claim 35, further comprising:

means for storing a plurality of predetermined reference values and a plurality of gain offset values, wherein each of a respective predetermined reference value and gain offset value are associated with a different output power level of the power amplifying means.

42. The system of claim 35, wherein the system is formed on a monolithic substrate.

43. The system of claim 35, wherein the system is compliant with a standard selected from the group consisting of I.E.E.E. 802.11, 802.11a, 802.11b, 802.11g, 802.11h, 802.11i and 802.11n.

44. An integrated circuit, comprising:

the system of claim 35.

45. A method for modifying output power, comprising the steps of:
  a.) amplifying an input signal;
  b.) amplifying power of an output of step (a); and
  c.) controlling a gain of step (a),
    wherein step (a) is responsive to step (c), and
    wherein step (c) comprises the steps of:
    c1.) comparing an output power level of step (b) to a predetermined reference value to generate a gain control signal, and
    c2.) offsetting the gain control signal by a gain offset value;
  d.) changing the output power level of step (b) from a first output power level to a second output power level,
    wherein a first predetermined reference value and a first gain offset value associated with the first output power level are changed substantially concurrently to a second predetermined reference value and a second gain offset value, respectively, associated with the second output power level, wherein at least the second predetermined reference value is a stored value that is selected based on the second output power level; and
  e.) storing a plurality of predetermined reference values and a plurality of gain offset values in a memory,
    wherein each of a respective predetermined reference value and gain offset value are associated with a different output power level of step (b).

46. A method for modifying output power, comprising the steps of:
  a.) amplifying an input signal:
  b.) amplifying power of an output of step (a): and
  c.) controlling a gain of step (a).
    wherein step (a) is responsive to step (c), and
    wherein step (c) comprises the steps of:
    c1.) comparing an output power level of step (b) to a predetermined reference value to generate a gain control signal, and
    c2.) offsetting the gain control signal by a gain offset value; and
  d.) changing the output power level of step (b) from a first output power level to a second output power level,
    wherein a first predetermined reference value and a first gain offset value associated with the first output power level are changed substantially concurrently to a second predetermined reference value and a second gain offset value, respectively, associated with the second output power level, wherein at least the second predetermined reference value is a stored value that is selected based on the second output power level, wherein step (c) further comprises the steps of:
    c3.) sensing a temperature; and
    c4.) offsetting the gain control signal by a temperature offset value associated with the temperature sensed by step (c3),
      wherein the temperature offset value modifies the gain control signal to compensate the gain of step (a) for variations in the temperature.

47. The method of claim 46, wherein step (c) further comprises the step of:
  c5.) converting the temperature sensed by step (c3) into the temperature offset value.

48. The method of claim 45, wherein step (c) further comprises the step of:
  c3.) accumulating the output of step (c1),
    wherein the gain offset value offsets an output of step (c3).

49. The method of claim 48, wherein the output of step (c3) is incremented by a predetermined value when the output of step (c1) is positive, and
  wherein the output of step (c3) is decremented by the predetermined value when the output of step (c1) is negative.

50. The method of claim 45, wherein step (c) further comprises the step of:
  c3.) detecting the output power level of the step (b).

51. The method of claim 45, wherein the method is compliant with a standard selected from the group consisting of I.E.E.E. 802.11, 802.11a, 802.11b, 802.11g, 802.11h, 802.11i and 802.11n.

52. A method for modifying output power, comprising the steps of:
  a.) amplifying a signal;
  b.) amplifying power output by step (a);
  c.) controlling a gain of step (a),
    wherein step (a) is responsive to step (c),
    wherein an output power level of step (b) is compared to a predetermined reference value by step (c) to generate a gain control signal, and
    wherein the gain control signal is offset by a gain offset value;
  d.) sensing a temperature,
    wherein the gain control signal is further offset by a temperature offset value associated with the temperature sensed by step (d),
    wherein the temperature offset value alters the gain control signal to compensate the gain of step (a) for variations in the temperature; and
  e.) changing the output power level of the step (b) from a first output power level to a second output power level,
    wherein a first predetermined reference value and a first gain offset value associated with the first output power level are changed substantially concurrently to a second predetermined reference value and a second gain offset value, respectively, associated with the second output power level.

53. The method of claim 52, further comprising the step of:
  f.) converting the temperature sensed by step (d) into the temperature offset value.

54. The method of claim 52, wherein step (c) comprises the step of:
  c1.) comparing the output power level of step (b) with the predetermined reference value.

55. The method of claim 54, wherein step (c) comprises the step of:
  c2.) accumulating the output of step (c1),
    wherein the gain offset value offsets an output of step (c2).

56. The method of claim 55, wherein the output of step (c2) is incremented by a predetermined value when the output of step (c1) is positive, and wherein the output of step (c2) is decremented by the predetermined value when the output of step (c1) is negative.

57. The method of claim 52, wherein step (c) comprises the step of:
   c1.) detecting the output power level of step (b).

58. The method of claim 52, further comprising the step of:
   f.) storing a plurality of predetermined reference values and a plurality of gain offset values,
   wherein each of a respective predetermined reference value and gain offset value are associated with a different output power level of step (b).

59. The method of claim 52, wherein the method is compliant with a standard selected from the group consisting of I.E.E.E. 802.11, 802.11a, 802.11b, 802.11g, 802.11h, 802.11i and 802.11n.

* * * * *